United States Patent [19]
Schultz et al.

[11] 3,958,857
[45] May 25, 1976

[54] SNAP-IN ELECTRICAL CONNECTOR ASSEMBLY

[75] Inventors: Ronald L. Schultz, Northfield; Stanley A. Linkowski, Franklin Park, both of Ill.

[73] Assignee: Chromalloy-Alcon Inc., Chicago, Ill.

[22] Filed: Nov. 4, 1974

[21] Appl. No.: 520,471

[52] U.S. Cl. .............................. 339/128; 248/27 R
[51] Int. Cl.² .......................................... H01R 13/48
[58] Field of Search .......... 248/27; 339/75 A, 75 P, 339/91 R, 125 R, 125 L, 126 R, 126 RS, 128, 132 R, 132 T, 133 R, 133 T

[56] References Cited
UNITED STATES PATENTS

| | | | |
|---|---|---|---|
| 2,424,757 | 7/1947 | Klumpp | 339/128 |
| 3,159,281 | 10/1964 | Frank | 339/126 R |
| 3,227,992 | 1/1966 | Strong | 248/27 X |
| 3,263,200 | 6/1966 | Kocmich | 339/126 RS X |

*Primary Examiner*—Gerald A. Dost
*Attorney, Agent, or Firm*—Hill, Gross, Simpson, Van Santen, Steadman, Chiara & Simpson

[57] ABSTRACT

A snap-in electrical connector assembly, more particularly a power transistor socket, has a body provided with a plurality of retaining fingers each of which has a plurality of retaining shoulder lugs located in differential spaced relation to the plane of a base surface of the body so that the assembly can be mounted on selectively a plurality of different thicknesses of supporting panel by simple snap-in mounting procedure. A positive mounted retention of the assembly is maintained, but release and removal are facilitated. As many as four different mounting panel thicknesses are accommodated according to preferred examples.

13 Claims, 5 Drawing Figures

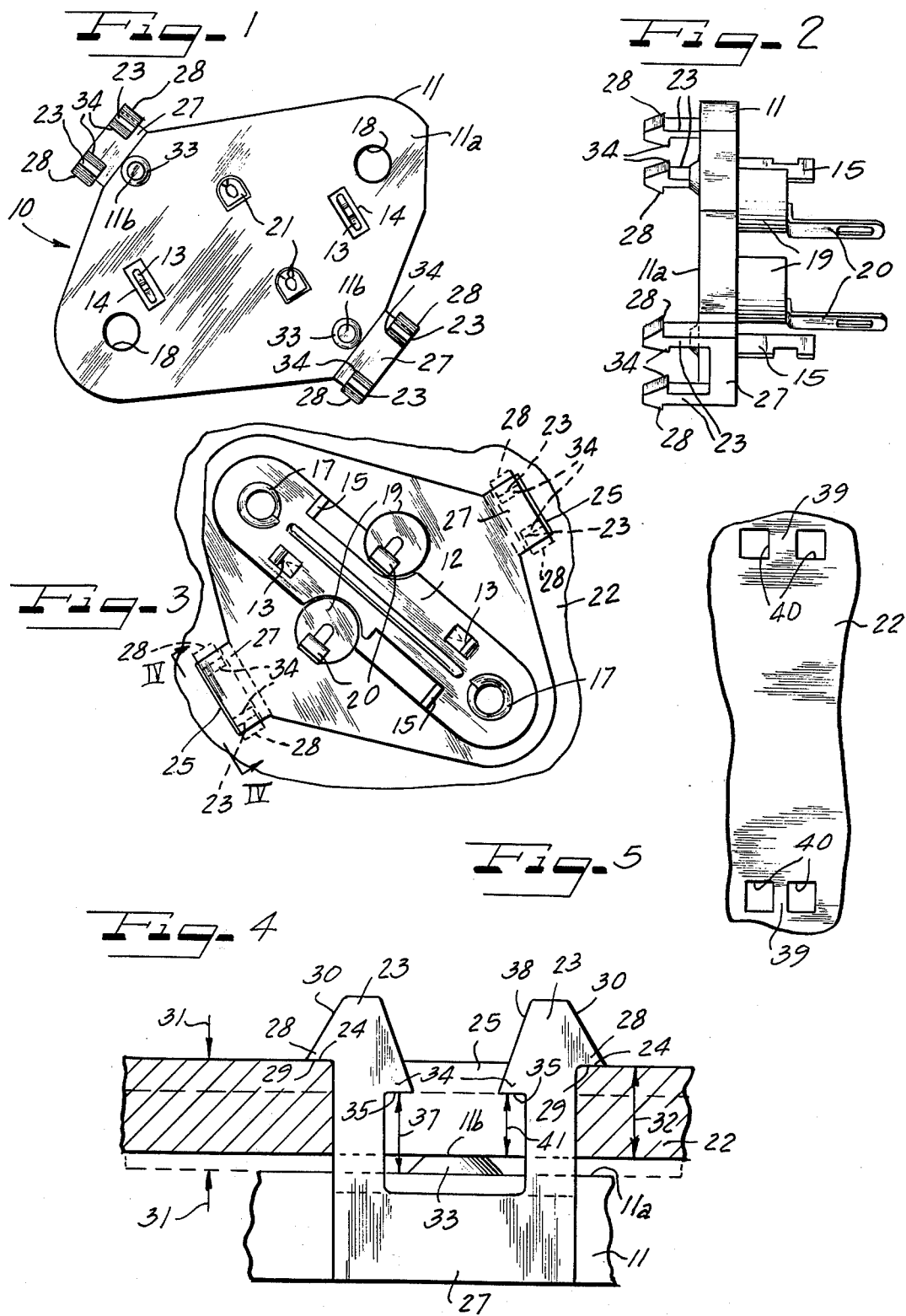

SNAP-IN ELECTRICAL CONNECTOR ASSEMBLY

This invention relates to snap-in electrical connector assemblies, and is more particularly concerned with a construction especially suitable for transistor sockets.

Transistor sockets of the kind exemplified herein comprise a body panel made from dielectric material and carrying electrically conductive contact means for connection in an electrical circuit including transistors. Heretofore, such transistor socket assemblies have been secured in place in mounted relation to heat sinks or chassis by means of separate fasteners i.e. rivets. This involves a time-consuming assembly procedure requiring rivet setting equipment.

A much simpler assembly procedure would be to provide the connector assembly body with snap-in finger means to engage with the supporting structure such as chassis panel by simply thrusting the connector assembly into position wherein the retaining fingers will snap into retaining relation with the panel on which the connector is mounted. A serious problem with this sort of connection is that the preferred thickness of the panels to which the connectors are to be mounted will vary with different manufacturers and designs of electrical apparatus employing the connectors. Consequently, where, for example, the retaining fingers are molded or cast as integral one-piece elements on the dielectric bodies of the connectors, different dies have heretofore been considered necessary to produce the properly dimensioned retaining fingers to meet different mounting panel thicknesses, thus contributing to increased cost in producing the connectors, especially for relatively small quantities, or requiring stockpiling quantities of connectors designed for different thicknesses of mounting panel.

A principal object of the present invention is to overcome the foregoing problems, disadvantages, deficiencies, and shortcomings of prior constructions and to provide in a single structure the capability of mounting the same connector on a plurality of different thicknesses of supporting panel.

Another object of the invention is to provide a new and improved snap-in electrical connector assembly having retaining fingers provided with a plurality of differentially located retaining shoulders to permit mounting selectively on supporting panels of different thicknesses.

A further object of the invention is to provide a new and improved snap-in electrical connector affording a substantial range of accommodation to different shoulder dimensions of mounting structure.

Still another object of the invention is to improve the mounting of snap-in electrical connector assemblies.

According to features of the invention, there is provided a new and improved snap-in electrical connector assembly especially suitable for use in a transistor socket and comprising a dielectric body carrying thereon electrically conductive contact means, said body having a base surface for engagement with a supporting panel, a plurality of spaced snap-in retaining fingers on said body projecting through and beyond the plane of said base surface to extend into retaining position alongside shoulder means on the supporting panel engaged by said base surface, each of said fingers having a first retaining shoulder lug at one side thereof, said first shoulder lugs having retaining shoulders disposed in a common plane in spaced parallel relation to said base surface plane and retainingly engageable with supporting structure shoulder means of a supporting panel corresponding in thickness to the spacing between said first lug shoulders and said base surface plane, and second shoulder lugs on another side of each of said fingers and having shoulders in a plane offset from said first lug shoulders and facing toward said base surface plane for engagement with shoulder means of a supporting panel of a thickness corresponding to the spaced relation of said second lug shoulders from said base surface plane.

According to other features of the invention the number of different panel thicknesses on which the connector assembly may be mounted can be increased by providing raised spacer pads on said body to provide a base surface in a differential plane relative to a principal base surface on the connector body.

Other objects, features and advantages of the invention will be readily apparent from the following description of certain preferred embodiments thereof, taken in conjunction with the accompanying drawing although variations and modifications may be effected without departing from the spirit and scope of the novel concepts embodied in the disclosure, and in which:

FIG. 1 is a rear plan view of a snap-in electrical connector assembly embodying features of the invention.

FIG. 2 is a side elevational view of the connector.

FIG. 3 is a front plan view of the connector.

FIG. 4 is an enlarged more or less schematic sectional elevational view taken substantially along the line IV—IV and demonstrating versatility of the snap-in attachment arrangement to accommodate mounting panels of different thicknesses; and FIG. 5 is a fragmentary plan view of a mounting panel showing clearance holes and shoulder means differently oriented than in FIG. 3.

Referring to FIGS. 1, 2 and 3, a snap-in electrical connector assembly 10, more particularly identifiable as a transistor socket, comprises a generally flat rigid panel body 11 formed from suitable dielectric material which can be readily molded or cast in the desired shape. Electrically conductive contact means are carried by the body 11, such as an elongated flat metal bar 12 mounted on a front face of the body and secured thereto as by means of shear lugs 13 extending through suitable holes 14 in the body and anchored to the body. Upstanding contact arms 15 are sheared from and bent out of the plane of the bar 12. Integral nut formations 17 adjacent to opposite ends of the bar 12 are aligned with clearance holes 18 in the body 11 for effecting heat sink connections with the bar 12. In addition, the body 11 carries two bosses 19 projecting from the front face of the body. A pair of elongated electrical contact elements 20 provided with jack sockets 21 into which connecting plugs (not shown) are adapted to be engaged from the back of the connector assembly.

According to the present invention, new and improved means are provided for mounting and securing the connector assembly 10 in place on a mounting panel 22 of any preferred construction such as in a chassis of electrical apparatus in which the connector assembly is used, and which panel may be a so-called heat sink, that is a heat conductor for removing excess electrically generated heat away from the connector assembly 10. For this purpose, the body 11 has a plurality of spaced snap-in retaining fingers 23 thereon which project through and beyond the plane of the back or base surface 11a of the body 11 to extend into retaining position alongside shoulder means provided by marginal areas at the backside of the panel 22 contiguous to suitable apertures 25 through the panel and through which the retaining fingers 23 extend when the assembly 10 is mounted in position with the back face 11a contiguous to the front face of the panel. If preferred, one of the retaining fingers 23 could be provided at each of respective opposite sides of the body 11, but in a preferred arrangement, two pairs of the fingers 23 are provided as complementary sets at opposite sides of the body 11 for enhanced, stabilized connector retaining cooperation.

In a desirable construction, the retaining fingers 23 are constructed integrally in one piece with the body 11 as part of the molded or cast construction of the body, a suitable plastic material being employed which although sufficiently rigid in the main area of the body to thoroughly resist deformation, has a sufficient inherent resiliency in relatively small section to permit slight resilient yielding to enable snap-in action of the retaining fingers 23. In the arrangements shown, each pair of the fingers 23 is carried by a respective lateral ear projection 27 integral with the body 11.

Each of the fingers 23 is constructed substantially alike and in each pair the fingers are in suitably spaced adjacency, coextensive and of identical construction but in an allochiral arrangement. Each of the fingers 23 has a first retaining shoulder lug 28 on one side thereof, in this instance at the side which is remote from the companion finger. Each of the lugs 28 has a retaining shoulder 29 disposed in a common plane with the shoulder 29 of the companion lug 28 and in spaced parallel relation to the plane of the base surface 11a. Each of the lugs 28 has a leadin cam surface 30 extending obliquely from the tip of the associated finger 23 to the distal end of the shoulder 29. The spacing between the finger tip ends of the cam surfaces 30 is no greater than and preferably slightly less than the width of the clearance opening 25 through which the fingers 23 are to extend. Thereby snap-in engagement of the fingers 23 with the panel 22 is simply effected by lining up the respective sets of fingers 23 with the holes 25 in the panel 22 and pressing the body 11 toward the panel, the cam surfaces 30 engaging the surfaces defining opposite sides of the respective openings 25, resiliently flexing the fingers 23 toward one another to the extent necessary to pass the lugs 28 through the openings; and when the shoulder lugs 28 have cleared through the associated opening 25, the fingers snap apart and the shoulders 29 engage retainingly with the shoulders 24 of the panel 22.

The spacing of the lug shoulders 29 from the primary base surface plane 11a of the body 11 is calculated for thickness of the panel 22 so that there will be reasonably firm retaining engagement effected by the fingers 23 with the panel after the snap-in mounting of the connector 10. Inasmuch as the specifications for the supporting panel requirements for different manufacturers, or for different types of apparatus often vary as to panel thickness, means are provided to facilitate accommodating such thickness variations. Within the industry the panel thickness variations are generally within a range of standards. Although the spacing between the shoulders 29 and body surface 11a is preferably sufficient to accommodate the thickest panel that may be expected to be specified, such thickness being indicated in FIG. 4 between the arrows 31, a next thinner thickness of panel such as indicated by the arrow 32 can be accommodated by providing the surface 11a with integral raised take-up spacer pads 33 at least one of which is located adjacent to each of the sets of retaining fingers 23 and providing a secondary base surface 11b for engagement with the face of the panel opposite to the face which has the shoulders 24. Thus, if the connector 10 is supplied for mounting on a panel specified as having a thickness as represented by the arrows 31, the spacer pads 33 will be omitted so that the primary base surface 11a will engage the panel in the mounted relation of the connector. If the thinner panel dimension represented by the arrow 32 is specified, the body 11 will be equipped with the spacer pads 33 so that the thinner panel will be engaged firmly between the secondary face surface 11b and the shoulders 29 and the primary surface 11a will remain in spaced opposition to the panel.

Two additional mounting panel thicknesses can be accommodated by providing the retaining fingers 23 with second shoulder lugs 34 on the opposite sides from the shoulder lugs 28 and provided with retaining shoulders 35 in a plane offset from the first lug shoulders 29 and facing toward the base surface plane provided by primary surface 11a. In this instance the shoulders 35 are located in a closer spaced relation to the surface 11a so as to accommodate a panel thickness represented by the arrows 37 which is thinner than the panel thickness represented by the arrows 32. Each of the lugs 34 is provided with a lead-in cam surface extending obliquely from the finger tip to the distal side of the shoulder 35 and with the finger tip ends of the cam surfaces 38 spaced apart a slightly greater distance than the width of a shoulder bar 39 (FIG. 5) between clearance apertures 40 through which the fingers 23 are projected to effect camming of the lug ends of the fingers 23 past the shoulder bar 39 until the shoulder lugs 34 pass by the bar 39 and the resiliently flexed fingers 23 snap the shoulders 35 into engagement with the associated shoulder bar 39. Where a still thinner panel represented by the arrows 41 must be accommodated, the body 11 may be supplied with the integral spacer pads 33 to provide the proper mounting space between the shoulders 35 and the base surface of the body 11 provided by the surfaces 11b of the spacer 33.

Although four different panel thicknesses, 31, 32, 37 and 41 have been shown as representative, it will be appreciated that other thicknesses of mounting panel may be accommodated simply by varying the thickness of height of the spacer pads 33 so as to vary the spacing between the shoulders 29 and 35 and the secondary base surface plane across the pad surfaces 11b. It will thus be appreciated that the spacer pads 33 greatly increase the mounting pad thickness accommodating versatility of the connector 10. Costwise the spacer pads 33 are advantageous because they permit a substantial reduction in die costs for producing the connector 10 to meet user specifications in respect to mounting panel thickness. Only one basic molding or casting die may be provided for producing the body 11 and the retaining fingers 23. For all thicknesses of mounting panel to be accommodated, the shoulder lugs 28 and 34 can remain standard and unchangeable. If either the mounting panel thickness 31 or the mounting panel thickness 37 needs to be accommodated, the spacer pads 33 will be omitted. In the molding or casting process, this can be very easily effected by providing the forming die with simple filler slugs in the molding cavities at the sites of the pads 33 so that the secondary base surface 11a will be plane for direct engagement with a mounting face of the panel of either the thickness 31 or 37 to be accommodated. Where a particular specified smaller thickness of panel such as 32 or 41 must be accommodated, the molding cavities for the spacer pads 33 are left open in the molding or casting process.

For assuring proper desired orientation of the connector 10 for its intended purpose on the panel 22, spacing of the fingers 23 in one set may be, as shown, differential relative to the spacing between the fingers of the other set, that is one set of the fingers may be more closely spaced than the other set. The finger clearing apertures 25 and 40 as well as the shoulder bars 39 are for this purpose correspondingly differentially dimensioned. Therefore, when mounting the connector 10, it must be properly oriented in order to pass the retaining fingers through the appropriate apertures. It will also be understood that although not specifically shown herein, the mounting panel 22 may be provided with other suitable apertures aligned with elements of the connector 10 such, for example, as to accommodate heat sink bolt means to engage with the nut formations 17 and to provide clearance access to the jack sockets 21.

It will be understood that variations and modifications may be effected without departing from the spirit and scope of the novel concepts of this invention.

We claim as our invention:

1. In a snap-in electrical connector assembly comprising a dielectric body carrying thereon electrically conductive contact means, said body having a base surface for engagement with a supporting panel, the improvement comprising:
   a plurality of spaced snap-in retaining fingers on said body projecting through and beyond the plane of said base surface to extend into retaining position alongside shoulder means on the supporting panel engaged by said base surface;
   each of said fingers having a first retaining shoulder lug on one side thereof;
   said first shoulder lugs having retaining shoulders disposed in a common plane in spaced parallel relation to said base surface plane and retainingly engageable with shoulder means of a supporting panel corresponding in thickness to the spacing between said first lug shoulders and said base surface plane; and
   second shoulder lugs on another side of each of said fingers and having shoulders in a plane offset from said first lug shoulders and facing toward said base surface plane for engagement with shoulder means of a supporting panel of a thickness corresponding to the spaced relation of said second lug shoulders from said base surface plane.

2. An electrical connector assembly according to claim 1 in which said fingers are resiliently flexible and have respective lead-in cam surfaces on said shoulder lugs leading from tip ends of the fingers to said shoulders.

3. An electrical connector assembly according to claim 1, wherein said fingers comprise sets at respective opposite sides of said body, each set of fingers comprising a pair spaced apart and relatively resiliently flexible, said first shoulder lugs projecting away from one another on the two fingers in each set, and said second shoulder lugs projecting generally toward one another on the two fingers of each set.

4. An electrical connector assembly according to claim 1, wherein said retaining fingers comprise a pair in spaced adjacency and the fingers being resiliently flexibly movable toward and away from one another, said first shoulder lugs being located on sides of the fingers remote from one another, and said second shoulder lugs being on sides of the fingers which are nearest one another.

5. An electrical connector assembly according to claim 1, including spacer pad means projecting from said base surface plane comprising a primary surface and said pad means providing a secondary base surface plane for accommodating supporting panel thicknesses between said secondary base surface panel and said retaining shoulders of less thickness than supporting panel thicknesses accommodated between said retaining shoulders and said primary surface.

6. An electrical connector assembly according to claim 5, wherein said retaining fingers comprise sets of pairs of the fingers at respectively opposite sides of said body, and said spacer pad means comprise respective button-like projections from said primary base surface and located adjacent to said sets of fingers.

7. An electrical connector assembly according to claim 1, in combination with the supporting panel, the supporting panel having clearance apertures therein through which the retaining fingers extend and provided with shoulder surfaces alongside the apertures for engagement by the shoulders of the shoulder lugs on a selected side of the fingers.

8. A combination according to claim 7, wherein the retaining fingers comprise an adjacent spaced pair, said shoulder lugs on said selected side of the fingers projecting generally toward one another, said apertures being separated by a shoulder bar providing said shoulder means engaged by the shoulders of said lugs projecting generally toward one another.

9. A combination according to claim 7, including spacer pad means on said base surface engaging said panel and maintaining it spaced from said base surface.

10. In a snap-in electrical connector assembly comprising a dielectric body carrying thereon electrically conductive contact means, said body having a primary base surface for opposition to a supporting panel, the improvement comprising:
    a plurality of spaced snap-in retaining fingers carried by said body and projecting from the plane of said primary base surface to extend into retaining position alongside shoulder means on the supporting panel;
    each of said fingers having a shoulder in spaced relation to and facing toward said primary base surface; and
    spacer pad means projecting from said primary base surface and providing secondary base surface spaced from said primary surface and adapted to accommodate a thinner supporting panel than may be engaged between said primary base surface and said retaining shoulders, said secondary surface of the pad means being engageable with one side of the thinner supporting panel which is adapted to be engaged on its other side by said retaining shoulders.

11. An electrical connector assembly according to claim 10, wherein said retaining fingers have additional shoulders offset relative to said first mentioned shoulders and of a different spaced relation to said primary base surface so as to accommodate a panel of a thickness which corresponds to the spacing between the spacer pad means secondary base surface and the additional shoulders.

12. An assembly according to claim 10, wherein said retaining fingers comprise sets of pairs of the fingers at respectively opposite sides of the body, and said spacer pad means comprise respective button-like projections from said primary base surface and located adjacent to said sets of fingers.

13. An electrical connector assembly according to claim 10, wherein said body comprises a molded substanially rigid plastic member on which said fingers and said pad means are integrally molded with the body, the fingers being of sufficiently small section to permit resilient yielding thereof for snap-in retaining engagement of said retaining shoulders with the supporting panel.

* * * * *